US012676207B2

(12) United States Patent
Loh et al.

(10) Patent No.: US 12,676,207 B2
(45) Date of Patent: Jul. 7, 2026

(54) READ THRESHOLD MANAGEMENT USING PAGE TYPE

(71) Applicant: Micron Technology, Inc., Boise, ID (US)

(72) Inventors: Zixiang Loh, San Jose, CA (US); Steven Michael Kientz, Westminster, CO (US); Patrick R. Khayat, San Diego, CA (US); Shantilal Doru, San Diego, CA (US); Jun Wan, San Jose, CA (US); Ying Yu Tai, Mountain View, CA (US)

(73) Assignee: Micron Technology, Inc., Boise, ID (US)

( * ) Notice: Subject to any disclaimer, the term of this patent is extended or adjusted under 35 U.S.C. 154(b) by 57 days.

(21) Appl. No.: 18/775,848

(22) Filed: Jul. 17, 2024

(65) Prior Publication Data

US 2026/0023647 A1 Jan. 22, 2026

(51) Int. Cl.
| | |
|---|---|
| *G11C 29/52* | (2006.01) |
| *G06F 11/07* | (2006.01) |
| *G06F 11/10* | (2006.01) |
| *G11C 16/26* | (2006.01) |

(52) U.S. Cl.
CPC ............ *G11C 29/52* (2013.01); *G06F 11/076* (2013.01); *G06F 11/1048* (2013.01); *G06F 11/1068* (2013.01); *G11C 16/26* (2013.01)

(58) Field of Classification Search
CPC ..... G06F 11/1068; G06F 11/076; G11C 16/26
See application file for complete search history.

(56) References Cited

U.S. PATENT DOCUMENTS

| | | | | |
|---|---|---|---|---|
| 9,286,993 | B2 * | 3/2016 | Lasser | ................. G11C 29/021 |
| 10,699,791 | B2 * | 6/2020 | Pletka | .................. G06F 3/0604 |
| 12,154,620 | B2 * | 11/2024 | Chen | ........................ G11C 8/08 |
| 2019/0012228 | A1 * | 1/2019 | Hsiao | .................... G06F 11/076 |
| 2019/0348130 | A1 | 11/2019 | Reuter et al. | |
| 2020/0066361 | A1 | 2/2020 | Ioannou et al. | |
| 2020/0075111 | A1 * | 3/2020 | Sheperek | ........... G11C 16/3459 |
| 2021/0004158 | A1 * | 1/2021 | Pletka | .................... G06F 3/061 |
| 2022/0027721 | A1 | 1/2022 | Zhang et al. | |

(Continued)

OTHER PUBLICATIONS

"International Application Serial No. PCT US2025 036964, International Search Report mailed Nov. 6, 2025", 3 pgs.

(Continued)

*Primary Examiner* — Steve N Nguyen
(74) *Attorney, Agent, or Firm* — Schwegman Lundberg & Woessner, P.A.

(57) ABSTRACT

The present disclosure configures a system component, such as memory sub-system controller, to determine read thresholds for memory blocks. The controller selects a group of memory blocks stored in a set of memory components and determines that the group of memory blocks is associated with a current bin of a plurality of bins, each bin of the plurality of bins comprising a respective plurality of read threshold offsets. The controller samples data stored in the group of memory blocks across different page types using the current bin and, in response to sampling the data, associates the different page types of the group of memory blocks with respective pointers to different bins of the plurality of bins for subsequently reading data from the group of memory blocks.

20 Claims, 6 Drawing Sheets

(56)  References Cited

U.S. PATENT DOCUMENTS

| 2022/0068396 | A1* | 3/2022 | Rayaprolu | ........... | G11C 16/107 |
| 2022/0091953 | A1 | 3/2022 | Asadi et al. | | |
| 2022/0115079 | A1* | 4/2022 | Sheperek | ........... | G11C 16/3422 |
| 2023/0207023 | A1 | 6/2023 | Pletka et al. | | |

OTHER PUBLICATIONS

"International Application Serial No. PCT US2025 036964, Written Opinion mailed Nov. 6, 2025", 3 pgs.

* cited by examiner

500

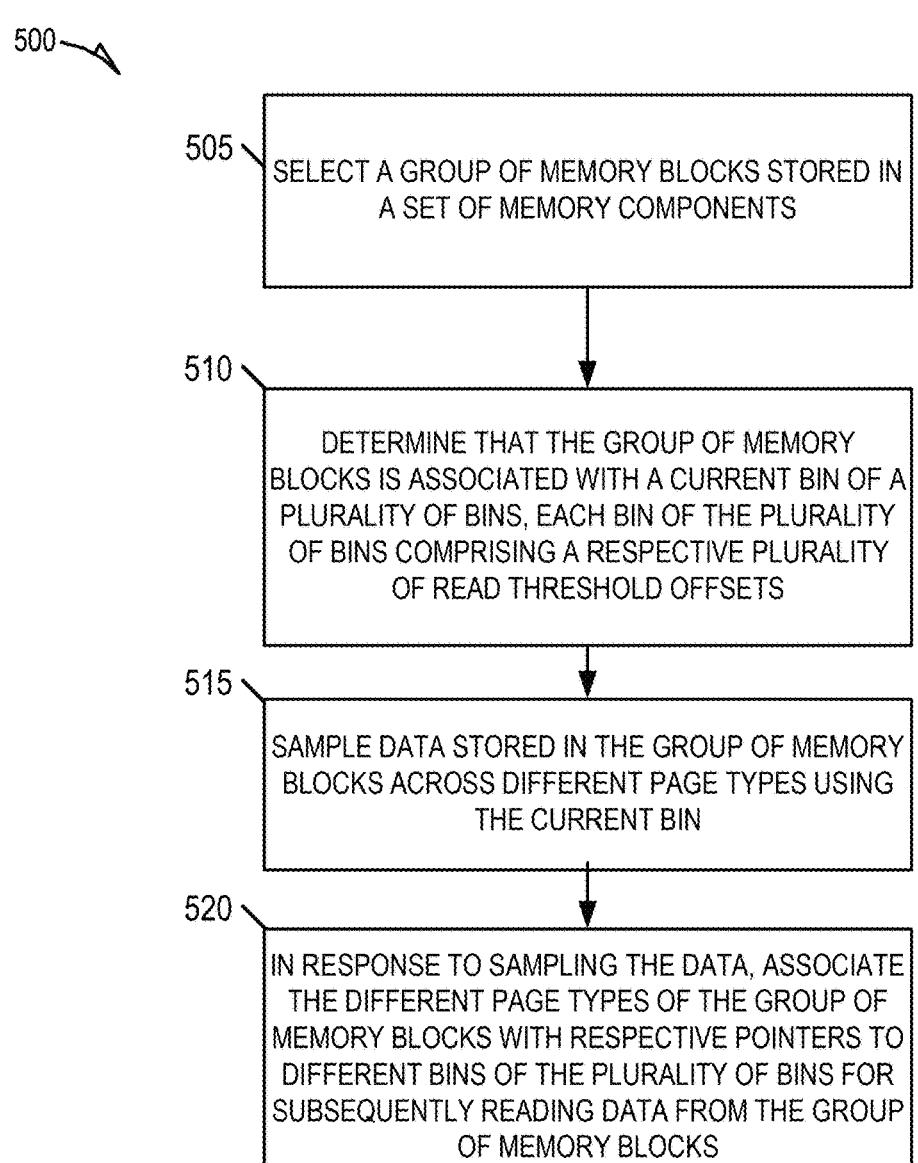

505 — SELECT A GROUP OF MEMORY BLOCKS STORED IN A SET OF MEMORY COMPONENTS

510 — DETERMINE THAT THE GROUP OF MEMORY BLOCKS IS ASSOCIATED WITH A CURRENT BIN OF A PLURALITY OF BINS, EACH BIN OF THE PLURALITY OF BINS COMPRISING A RESPECTIVE PLURALITY OF READ THRESHOLD OFFSETS

515 — SAMPLE DATA STORED IN THE GROUP OF MEMORY BLOCKS ACROSS DIFFERENT PAGE TYPES USING THE CURRENT BIN

520 — IN RESPONSE TO SAMPLING THE DATA, ASSOCIATE THE DIFFERENT PAGE TYPES OF THE GROUP OF MEMORY BLOCKS WITH RESPECTIVE POINTERS TO DIFFERENT BINS OF THE PLURALITY OF BINS FOR SUBSEQUENTLY READING DATA FROM THE GROUP OF MEMORY BLOCKS

*FIG. 5*

READ THRESHOLD MANAGEMENT USING PAGE TYPE

TECHNICAL FIELD

Examples of the disclosure relate generally to memory sub-systems and, more specifically, to correcting read levels in a memory sub-system.

BACKGROUND

A memory sub-system can be a storage system, such as a solid-state drive (SSD), and can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

FIG. 5 is a flow diagram of an example method to perform read error correction, in accordance with some examples.

DETAILED DESCRIPTION

Figure 1:
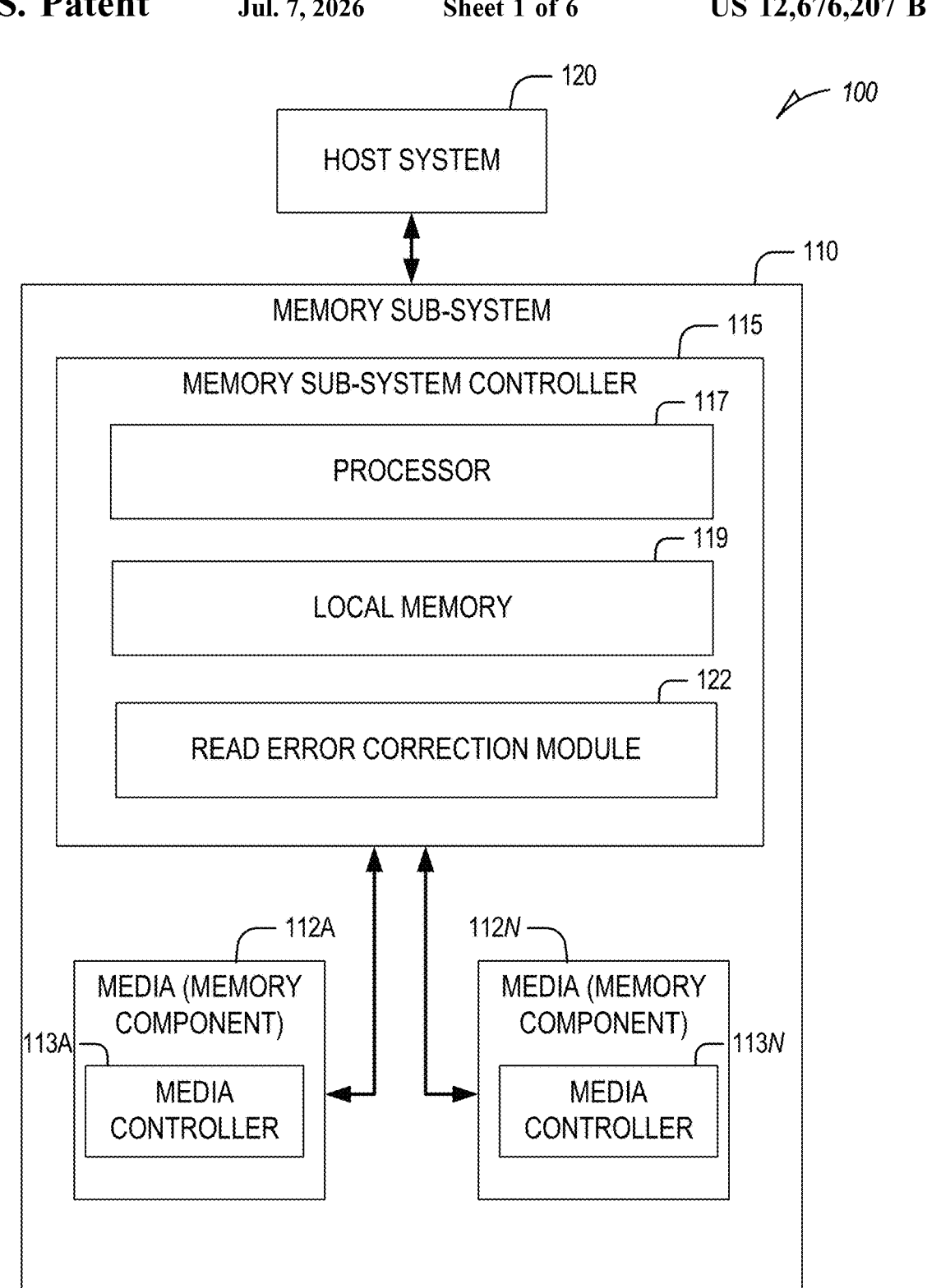
FIG. 1 is a block diagram illustrating an example computing environment including a memory sub-system, in accordance with some examples.

The present disclosure configures a system component, such as a memory sub-system controller, to detect and/or correct read thresholds of one or more memory components. Data can be read from memory components using different read bias levels or read levels (also referred to as read thresholds) which are usually determined from a corresponding BFEA bin of the memory group or block being read. The controller can accurately select a BFEA bin to use to read a memory group or block based on the page type being read. To do so, the controller periodically analyzes groups of memory components and samples data stored in the group of memory components across different page types. The sampled data can be analyzed for slow charge loss (SCL) and, based on the SCL, the controller can associate different page types with respective BFEA bins. In some cases, the controller can analyze the read bit error rate (RBER) associated with reading data from adjacent or nearby BFEA bins to associate the different page types with respective BFEA bins. This can reduce the RBER associated with performing read operations and enables the read operations to be performed more efficiently and faster, which improves the overall efficiency of operating the memory system.

A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components, such as memory devices that store data. The host system can send access requests (e.g., write command, read command, sequential write command, sequential read command) to the memory sub-system, such as to store data at the memory sub-system and to read data from the memory sub-system. The data specified by the host is hereinafter referred to as "host data" or "user data".

The memory sub-system can initiate media management operations, such as a write operation, on host data that is stored on a memory device. For example, firmware of the memory sub-system may re-write previously written host data from a location on a memory device to a new location as part of garbage collection management operations or folding operations. The data that is re-written, for example as initiated by the firmware, is hereinafter referred to as "garbage collection data."

"User data" can include host data and garbage collection data. "System data" hereinafter refers to data that is created and/or maintained by the memory sub-system for performing operations in response to host requests and for media management. Examples of system data include, and are not limited to, system tables (e.g., logical-to-physical address mapping table), data from logging, scratch pad data, etc.

A memory device can be a non-volatile memory device. A non-volatile memory device is a package of one or more dice. Each die can comprise one or more planes. Each logical block address (LBA) of the memory device comprises a set of pages. Each page comprises a set of memory cells, which store bits of data. The memory devices can be raw memory devices (e.g., NAND), which are managed externally, for example, by an external controller. The memory devices can be managed memory devices (e.g., managed NAND), which are raw memory devices combined with a local embedded controller for memory management within the same memory device package.

Conventional memory sub-systems store data at different read levels (corresponding to different page types). These page types are usually characterized as lower page (LP), upper page (UP), and extra page (XP). Specifically, in a tri-level cell (TLC) memory device, data can be stored in one of eight different read levels of the memory sub-system. Charges stored at the different read levels can be read and interpreted into a set of three bits. Ideally, the data is read by applying a read level (or read threshold) within a center of valley (CoV) which defines a range of voltage levels that can be applied to accurately read the data from an individual one of the eight different read levels or valleys.

In certain situations, the charges stored at one of the read levels can be lost or shifted around which results in inaccuracies when read at the predetermined read level or even within a previously computed CoV. In these circumstances, as part of correcting the read errors that are encountered, the read level or CoV used to read the data may need to be adjusted. BFEA in NAND devices utilizes a sophisticated method of selecting the read threshold voltage offset to improve data retrieval from different memory blocks or groups of memory blocks. In NAND flash memory, data storage and retrieval depend on accurately determining the threshold voltage levels, which can vary due to factors like SCL over time. BFEA addresses this by categorizing blocks into different bins, each associated with specific read threshold voltage offsets. These bins are dynamically adjusted to compensate for SCL on the XP (level 7 in TLC storage), a common issue in NAND devices where stored charge decreases gradually, affecting data integrity. By assigning blocks to different bins based on their threshold voltage requirements, BFEA ensures that each block is read with the most appropriate voltage level, enhancing reliability and accuracy in data retrieval. Over time, as the characteristics of the blocks change, the associated bins and their threshold offsets are recalibrated to maintain optimal performance. This dynamic adjustment helps in prolonging the lifespan of the NAND device and ensures stable performance throughout its usage.

The process of selecting the appropriate BFEA bin in conventional systems involves analyzing the SCL effect on level 7 (e.g., the last level in the TLC storage) of the TLC page. Samples are selected randomly from a group of memory blocks assigned to a particular BFEA bin and the level 7 movement is measured or calculated (e.g., the SCL is computed for the samples). The average of the SCL of the samples is computed and a BFEA bin table is searched to select a particular bin that corresponds to the average SCL measurement. The entire group of memory blocks is then assigned to the particular BFEA bin regardless of page type. While this approach generally works, different SCL can be encountered on different page types (e.g., pages on other levels, such as LP, UP, and XP). As such, applying the read threshold voltage offset of the particular bin across all of the page types in the group of memory blocks may result in sub-optimal RBER which can reduce the efficiency of operating the memory sub-system. This one-size-fits-all approach can fail over time which can cause delays, corruption, and data loss.

The present disclosure addresses the above and other deficiencies by configuring a system component, such as a memory sub-system controller of a memory sub-system, to detect and/or correct read thresholds of one or more memory components by page type. Namely, the disclosed controller can accurately select a BFEA bin to use to read a memory group or block based on the page type being read. In some cases, the controller periodically analyzes groups of memory components and samples data stored in the group of memory components across different page types. The sampled data can be analyzed for SCL and based on the SCL, the memory controller can associate different page types with respective BFEA bins. In some cases, the controller can analyze the RBER associated with reading data from adjacent or nearby BFEA bins to associate the different page types with respective BFEA bins. This can reduce the RBER associated with performing read operations and enables the read operations to be performed more efficiently and faster, which improves the overall efficiency of operating the memory system.

For instance, in some examples at least one processing device, operatively coupled to a set of memory components is configured to select (e.g., periodically) a group of memory blocks stored in the set of memory components and determine that the group of memory blocks is associated with a current bin of a plurality of bins, each bin of the plurality of bins including a respective plurality of read threshold offsets. The at least one processing device (e.g., memory controller) samples data stored in the group of memory blocks across different page types using the current bin; and in response to sampling the data and associates the different page types of the group of memory blocks with respective pointers to different bins of the plurality of bins for subsequently reading data from the group of memory blocks.

The memory controller associates a first page type of the group of memory blocks with a first pointer corresponding to a first bin of the plurality of bins and associates a second page type for the group of memory blocks with a second pointer corresponding to a second bin of the plurality of bins. The different page types can include a LP, an UP, and XP and the plurality of bins can include BFEA bins. In some examples, the memory controller stores a BFEA bin table including the plurality of bins, the BFEA bin table including a plurality of levels of a TLC page. A first set of bins can include a first set of read threshold offsets for each of the plurality of levels and a second of bins can include a second set of read threshold offsets for each of the plurality of levels.

The memory controller can read a plurality of pages across a plurality of blocks in the group of memory blocks using the current bin to generate a plurality of samples; measuring SCL movement for each of the plurality of samples on a first page type to generate a first set of samples. The memory controller can measure SCL movement for each of the plurality of samples on a second page type to generate a second set of samples. The memory controller can compute a first average of the first set of samples and select a first BFEA bin from the BFEA table based on the first average. The memory controller can associate the first page type of the group of memory blocks with the first BFEA bin using a first pointer.

In some examples, the memory controller can compute a second average of the second set of samples. The memory controller selects a second BFEA bin from the BFEA table based on the second average and associates the second page type of the group of memory blocks with the second BFEA bin using a second pointer. The first page type can correspond to level 5 of the plurality of levels and the second page type can correspond to levels greater than level 5 of the plurality of levels. The plurality of samples can be generated from reading three pages across three memory blocks on an individual word line group (WLG).

The memory controller can read one or more of pages of a first page type across one or more blocks in the group of memory blocks using the current bin to generate one or more samples. The memory controller can measure SCL movement for each of the one or more samples on the first page type to generate a first set of samples. The memory controller selects a first BFEA bin from the BFEA table based on the first set of samples and computes RBER information based on the first BFEA bin. The memory controller can associate the different page types of the group of memory blocks with the respective pointers based on the RBER information. In some examples, the first page type includes an XP page type corresponding to level seven of the plurality of levels.

In some examples, the memory controller can read a first set of data stored in a second page type across different pages and different memory blocks in the group of memory blocks using the first BFEA bin to compute a first set of the RBER samples. The memory controller reads a second set of data stored in the second page type across the different pages and the different memory blocks in the group of memory blocks using a second BFEA bin that is adjacent to the first BFEA bin to compute a second set of the RBER samples. The memory controller, for a first read portion of the different pages and the different memory blocks, can select a first best BFEA bin by comparing an individual sample of the first set of RBER samples with an individual sample of the second set of RBER samples to identify which is associated with a lower RBER. The memory controller, for a second read portion of the different pages and the different memory blocks, can select a second best BFEA bin by comparing another individual sample of the first set of RBER samples with another individual sample of the second set of RBER samples to identify which is associated with the lower RBER. The memory controller, for each read portion of the different pages and the different memory blocks, can select a best BFEA bin by comparing an individual sample of the first set of RBER samples with an individual sample of the second set of RBER samples to identify which is associated with a lower RBER.

The memory controller can determine that the best BFEA bin of a majority of the read portions of the different pages and the different memory blocks includes the second BFEA bin. The memory controller, in response to determining that the best BFEA bin of the majority of the read portions of the different pages and the different memory blocks includes the second BFEA bin, associates the second page type for the group of memory blocks with the second BFEA bin using a first pointer.

In some examples, the memory controller can read a third set of data stored in a third page type across different pages and different memory blocks in the group of memory blocks using the first BFEA bin to compute a third set of the RBER samples. The memory controller can read a fourth set of data stored in the third page type across the different pages and the different memory blocks in the group of memory blocks using the second BFEA bin that is adjacent to the first BFEA bin to compute a fourth set of the RBER samples. The memory controller, for each read portion of the different pages and the different memory blocks of the third page type, selects a best BFEA bin by comparing an individual sample of the third set of RBER samples with an individual sample of the fourth set of RBER samples to identify which is associated with a lower RBER. The memory controller can determine, for the third page type, that the best BFEA bin of a majority of the read portions of the different pages and the different memory blocks includes the first BFEA bin. The memory controller, in response to determining that the best BFEA bin of the majority of the read portions of the different pages and the different memory blocks includes the first BFEA bin, associates the second page type for the group of memory blocks with the first BFEA bin using a second pointer.

The memory controller can determine that the second set of RBER samples for the second page type corresponds to a lower RBER than the first set of RBER samples. The memory controller, in response to determining that the second set of RBER samples for the second page type corresponds to the lower RBER than the first set of RBER samples, associates the second page type for the group of memory blocks with the second BFEA bin. In some cases, the first set of samples includes one or more samples.

Though various examples are described herein as being implemented with respect to a memory sub-system (e.g., a controller of the memory sub-system, a memory component, a media controller, or a combination thereof), some or all of the portions of an example can be implemented with respect to a host system, such as a software application, an operating system of the host system, or only by the media controller rather than or in addition to the memory sub-system controller.

FIG. 1 illustrates an example computing environment 100 including a memory sub-system 110, in accordance with some examples of the present disclosure. The memory sub-system 110 can include media, such as memory components 112A to 112N (also hereinafter referred to as "memory devices"). The memory components 112A to 112N can be volatile memory devices, non-volatile memory devices, or a combination of such. In some embodiments, the memory sub-system 110 is a storage system. A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line line memory module (DIMM), a small outline DIMM (SO-DIMM), and a non-volatile dual in-line memory module (NVDIMM).

The computing environment 100 can include a host system 120 that is coupled to a memory system. The memory system can include one or more memory sub-systems 110. In some examples, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, embedded computer (e.g., one included in a vehicle, industrial equipment, or a networked commercial device), or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. Examples of a physical host interface include, but are not limited to, a serial advanced technology attachment (SATA) interface, a peripheral component interconnect express (PCIe) interface, a compute express link (CXL), a universal serial bus (USB) interface, a Fibre Channel interface, a Serial Attached SCSI (SAS) interface, etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe or CXL interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative- and (NAND)-type flash memory. Each of the memory components 112A to 112N can include one or more arrays of memory cells such as single-level cells (SCLs) or multi-level cells (MLCs) (e.g., TLCs or QLCs). In some examples, a particular memory component 112 can include both an SCL portion and an MLC portion of memory cells. Each of the memory cells can store one or more bits of data (e.g., blocks) used by the host system 120. The disclosed techniques are discussed in connection with a TLC storage but are similarly applicable to other types of storage, such as QLC and/or MLC storage.

Although non-volatile memory components such as NAND-type flash memory are described, the memory components 112A to 112N can be based on any other type of memory, such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto-resistive random access memory (MRAM), negative-or (NOR) flash memory, electrically erasable programmable read-only memory (EEPROM), and a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write-in-place operation, where a non-volatile memory cell can be programmed without the non-volatile memory cell being previously erased. Furthermore, the memory cells of the memory components 112A to 112N can be grouped as memory pages or LBAs that can refer to a unit of the memory component 112 used to store data. In some examples, the memory cells of the memory components 112A to 112N can be grouped into a set of different zones of equal or unequal size used to store data for corresponding applications. In such cases, each application can store data in an associated zone of the set of different zones.

The memory sub-system controller 115 can communicate with the memory components 112A to 112N to perform operations such as reading data, writing data, or erasing data at the memory components 112A to 112N and other such operations. The memory sub-system controller 115 can include hardware such as one or more integrated circuits and/or discrete components, a buffer memory, or a combination thereof. The memory sub-system controller 115 can be a microcontroller, special-purpose logic circuitry (e.g., a field programmable gate array (FPGA), an application specific integrated circuit (ASIC), etc.), or another suitable processor. The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, and so forth. The local memory 119 can also include read-only memory (ROM) for storing microcode. While the example memory sub-system 110 in FIG. 1 has been illustrated as including the memory sub-system controller 115, in another example of the present disclosure, a memory sub-system 110 may not include a memory sub-system controller 115, and can instead rely upon external control (e.g., provided by an external host, or by a processor 117 or controller separate from the memory sub-system 110).

In general, the memory sub-system controller 115 can receive commands or operations from the host system 120 and can convert the commands or operations into instructions or appropriate commands to achieve the desired access to the memory components 112A to 112N. The memory sub-system controller 115 can be responsible for other operations such as wear leveling operations, garbage collection operations, folding operations, error detection and ECC operations, decoding operations, encryption operations, caching operations, address translations between a logical block address and a physical block address that are associated with the memory components 112A to 112N, address translations between an application identifier received from the host system 120 and a corresponding zone of a set of zones of the memory components 112A to 112N. This can be used to restrict applications to reading and writing data only to/from a corresponding zone of the set of zones that is associated with the respective applications. In such cases, even though there may be free space elsewhere on the memory components 112A to 112N, a given application can only read/write data to/from the associated zone, such as by erasing data stored in the zone and writing new data to the zone. The memory sub-system controller 115 can further include host interface circuitry to communicate with the host system 120 via the physical host interface. The host interface circuitry can convert the commands received from the host system 120 into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM or other temporary storage location or device) and address circuitry (e.g., a row decoder and a column decoder) that can receive an address from the memory sub-system controller 115 and decode the address to access the memory components 112A to 112N.

The memory devices can be raw memory devices (e.g., NAND), which are managed externally, for example, by an external controller (e.g., memory sub-system controller 115). The memory devices can be managed memory devices (e.g., managed NAND), which is a raw memory device combined with a local embedded controller (e.g., local media controllers) for memory management within the same memory device package. Any one of the memory components 112A to 112N can include a media controller (e.g., media controller 113A and media controller 113N) to manage the memory cells of the memory component, to communicate with the memory sub-system controller 115, and to execute memory requests (e.g., read or write) received from the memory sub-system controller 115.

The memory sub-system 110 includes a read error correction module 122 that performs or facilitates determining read thresholds for memory blocks. The read error correction module 122 selects a group of memory blocks stored in a set of memory components and determines that the group of memory blocks is associated with a current bin of a plurality of bins, each bin of the plurality of bins comprising a respective plurality of read threshold offsets. The read error correction module 122 samples data stored in the group of memory blocks across different page types using the current bin and, in response to sampling the data, associates the different page types of the group of memory blocks with respective pointers to different bins of the plurality of bins for subsequently reading data from the group of memory blocks.

Depending on the example, the read error correction module 122 can comprise logic (e.g., a set of transitory or non-transitory machine instructions, such as firmware) or one or more components that causes the memory sub-system 110 (e.g., the memory sub-system controller 115) to perform operations described herein with respect to the read error correction module 122. The read error correction module 122 can comprise a tangible or non-tangible unit capable of performing operations described herein. Further details with regards to the operations of the read error correction module 122 are described below in connection to the read error correction module 200 shown and described in FIG. 2.

Figure 2:
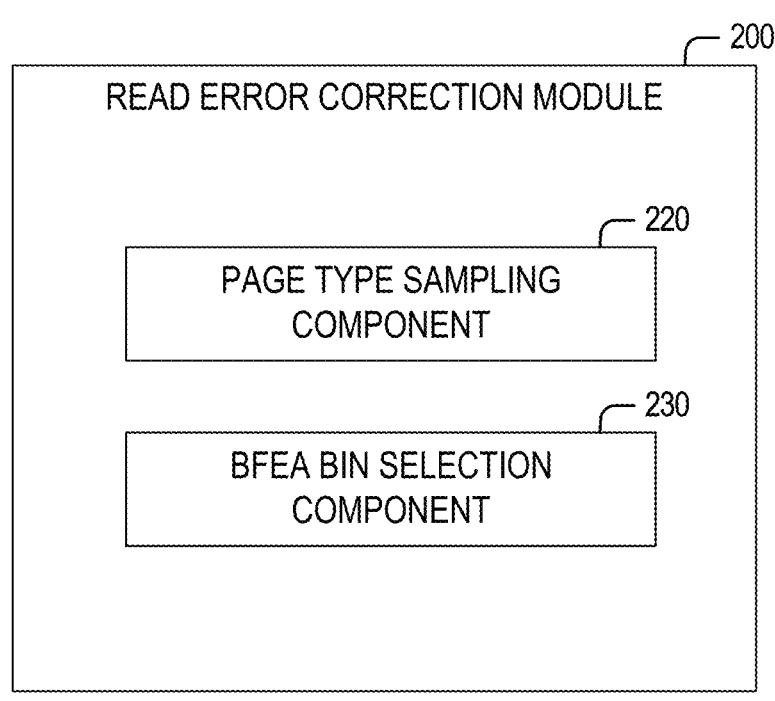
FIG. 2 is a block diagram of an example read error correction module, in accordance with some examples.

FIG. 2 is a block diagram of an example read error correction module 200, in accordance with some examples. As illustrated, the read error correction module 200 is one implementation of the read error correction module 122 (FIG. 1) and includes a page type sampling component 220 and a BFEA bin selection component 230. For some examples, the read error correction module 200 can differ in components or arrangement (e.g., less or more components) from what is illustrated in FIG. 2. The read error correction module 200 can be implemented by the memory sub-system controller 115 of FIG. 1 and/or by one or more of the media controllers 113A-N of FIG. 1.

The read error correction module 200 can be used to detect read errors associated with reading data from the memory components 112 of FIG. 1 according to an individual read level of a plurality of read levels. In some cases, the read error correction module 200 can be used after programming data to an individual memory block or page or after a threshold period of time has passed since data has been programmed to the memory block or page and/or periodically.

The read error correction module 200 can determine read thresholds for memory blocks. The read error correction module 200 selects a group of memory blocks stored in a set of memory components and determines that the group of memory blocks is associated with a current bin of a plurality of bins, each bin of the plurality of bins comprising a respective plurality of read threshold offsets. The read error correction module 200 samples data stored in the group of memory blocks across different page types using the current bin and, in response to sampling the data, associates the different page types of the group of memory blocks with respective pointers to different bins of the plurality of bins for subsequently reading data from the group of memory blocks.

Figure 3:
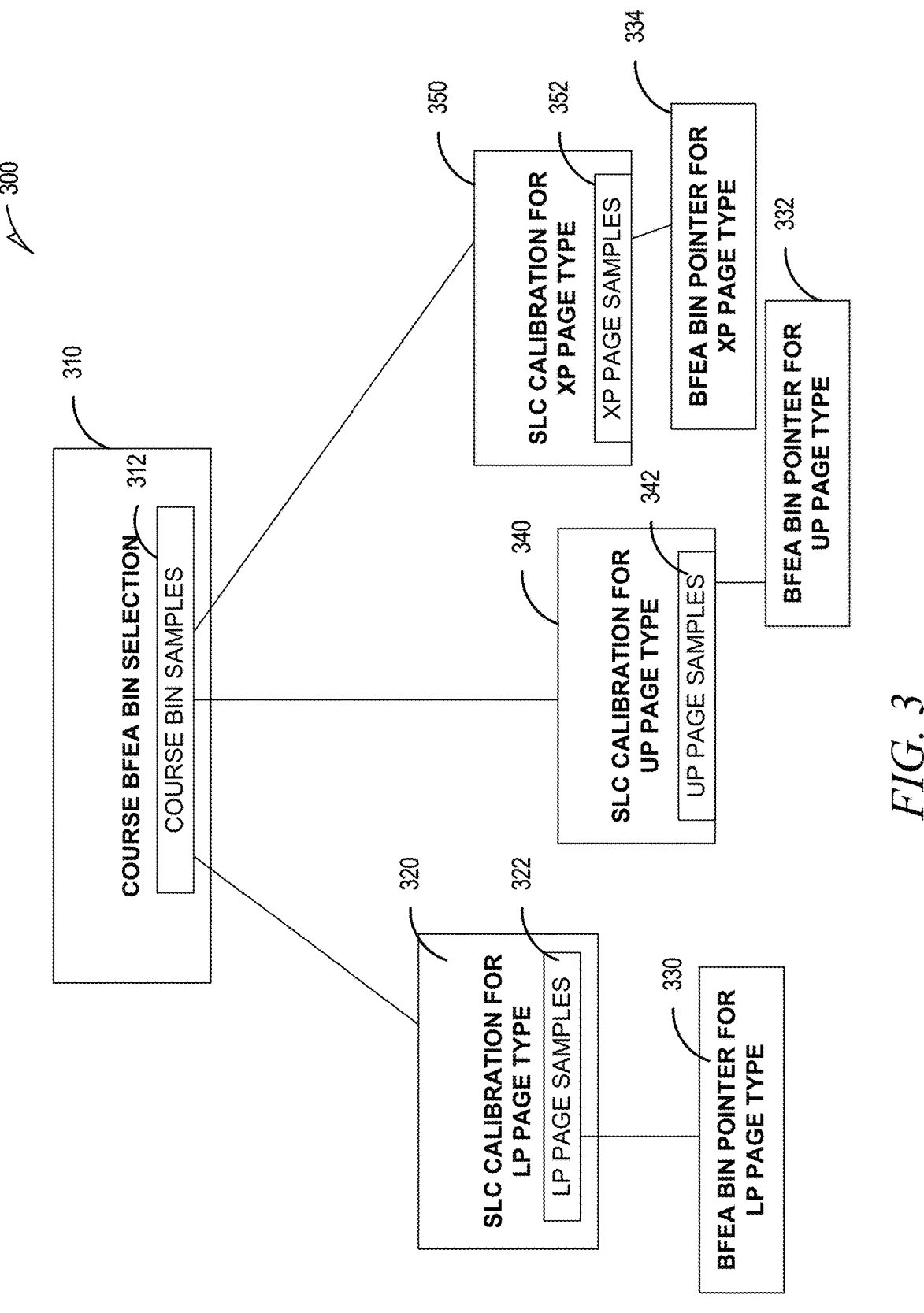
FIGS. 3 and 4 are block diagrams of processes performed by the read error correction module for associating block family error avoidance (BFEA) bins with different page types, in accordance with some examples.

For example, the read error correction module 200 can perform a coarse BFEA bin selection process followed by a fine or per page type BFEA bin association process. In some cases, the page type sampling component 220 selects a group of memory blocks, components, and/or portions. The page type sampling component 220, as shown in the diagram 300 of FIG. 3, initially performs a coarse BFEA bin selection process 310 on the selected group of memory blocks, components and/or portions (e.g., referred to as a group of memory blocks). The page type sampling component 220 can access a current BFEA bin of a BFEA bin associated with the selected group of memory blocks.

Namely, the page type sampling component 220 can access or store a BFEA bin table. The BFEA bin table can list a plurality of levels (e.g., levels 0-7 of TLC storage) and associates a corresponding read threshold voltage offset with each level. The BFEA bin can include multiple BFEA bins. Each bin can list a different set of read threshold voltage offsets with each of the plurality of levels. So, for a first BFEA bin, a first set of different read threshold voltage offsets can be associated with each respective one of the plurality of levels. For a second BFEA bin in the BFEA bin table, a second set of different read threshold voltage offsets can be associated with each respective one of the plurality of levels.

The page type sampling component 220 can determine that the group of memory blocks is currently assigned to a first BFEA bin. The page type sampling component 220 selects a plurality of pages randomly from the group of memory blocks and reads data stored in the plurality of pages using the read threshold voltage offsets of the currently assigned first BFEA bin. In some cases, the page type sampling component 220 samples three-page orders from a particular word line group across three memory blocks to generate nine initial samples 312.

For each of the nine initial samples 312, the page type sampling component 220 can calibrate on multiple page types (e.g., LP page type, UP page type, and XP page type). For example, the page type sampling component 220 can compute the SCL for the LP page type 320 to generate LP page samples 322 corresponding to level 5. The page type sampling component 220 can compute the SCL for the UP page type 340 to generate UP page samples 342 corresponding to level 6. The page type sampling component 220 can compute the SCL for the XP page type 350 to generate XP page samples 352 corresponding to level 7.

The page type sampling component 220 can provide the LP page samples 322, the page samples 342, and the XP page samples 352 to the BFEA bin selection component 230. The BFEA bin selection component 230 can process these samples to associate different page types of the group of memory blocks with respective BFEA bins in the BFEA bin table. For example, the BFEA bin selection component 230 can compute an average or some other statistical measure of the LP page samples 322. The BFEA bin selection component 230 can search the BFEA bin table to identify a BFEA bin that corresponds to a result of the average, or some other statistical measure of the LP page samples 322. In response to determining that a second BFEA bin of the plurality of BFEA bins matches the average or some other statistical measure of the LP page samples 322, the BFEA bin selection component 230 associates a first BFEA bin pointer for the LP page type of the group of memory blocks with the second BFEA bin at operation 330.

Similarly, the BFEA bin selection component 230 can compute an average or some other statistical measure of the UP page samples 342. The BFEA bin selection component 230 can search the BFEA bin table to identify a BFEA bin that corresponds to a result of the average or some other statistical measure of the UP page samples 342. In response to determining that a third BFEA bin of the plurality of BFEA bins matches the average or some other statistical measure of the UP page samples 342, the BFEA bin selection component 230 associates a second BFEA bin pointer for the UP page type of the group of memory blocks with the third BFEA bin at operation 332. The BFEA bin selection component 230 can compute an average or some other statistical measure of the XP page samples 352. The BFEA bin selection component 230 can search the BFEA bin table to identify a BFEA bin that corresponds to a result of the average, or some other statistical measure of the XP page samples 352. In response to determining that the third BFEA bin (or the second BFEA bin) of the plurality of BFEA bins matches the average or some other statistical measure of the XP page samples 352, the BFEA bin selection component 230 associates a third BFEA bin pointer for the XP page type of the group of memory blocks with the third BFEA bin at operation 334. By maintaining different BFEA bin pointers for different page types, the BFEA bin selection component 230 can retrieve read threshold voltage level offsets that are better suited for reading data with a lower RBER for individual page types. This improves the overall efficiency of operating the memory sub-system 110.

Figure 4:
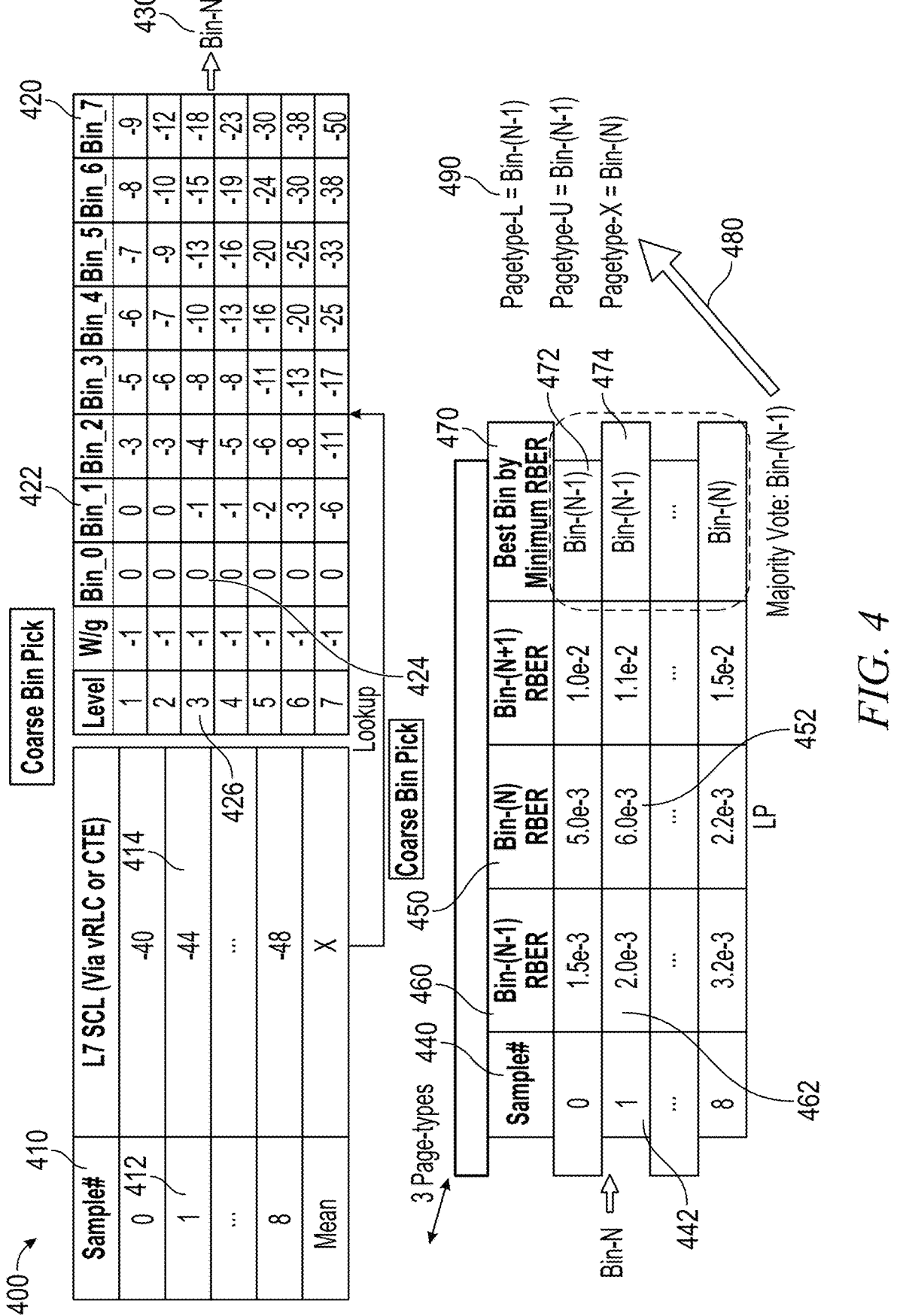

In some examples, the read error correction module 200 can perform a coarse BFEA bin selection process followed by a fine or per page type BFEA bin association process, as shown in the diagram 400 of FIG. 4. In such cases, the page type sampling component 220 of FIG. 2 selects a group of memory blocks, components, and/or portions. The page type sampling component 220 initially performs a coarse BFEA bin selection process on the selected group of memory blocks, components and/or portions (e.g., referred to as a group of memory blocks). The page type sampling component 220 can access a current BFEA bin of a BFEA bin associated with the selected group of memory blocks.

Namely, the page type sampling component 220 can access or store a BFEA bin table 420. The BFEA bin table 420 can list a plurality of levels 426 (e.g., levels 0-7 of TLC storage) and associates a corresponding read threshold voltage offset 424 with each level. The BFEA bin can include multiple BFEA bins 422. Each bin 422 can list a different set of read threshold voltage offsets 424 with each of the plurality of levels 426. So, for a first BFEA bin, a first set of different read threshold voltage offsets can be associated with each respective one of the plurality of levels 426. For a second BFEA bin in the BFEA bin table 420, a second set of different read threshold voltage offsets can be associated with each respective one of the plurality of levels 426.

The page type sampling component 220 can determine that the group of memory blocks is currently assigned to a first BFEA bin (e.g., bin 1 of the BFEA bin table 420). The page type sampling component 220 selects a plurality of pages randomly from the group of memory blocks and reads data stored in the plurality of pages using the read threshold voltage offsets of the currently assigned first BFEA bin. In some cases, the page type sampling component 220 samples three-page orders from a particular word line group across three memory blocks to generate nine initial samples 410. Each sample 412 can be associated with a respective SCL 414. The samples can be generated for a particular level (e.g., level 7) of the group of memory blocks or any other level or levels.

The page type sampling component 220 can compute a mean, average or other statistical measure from respective SCL 414 of the samples 410. Based on the computed mean, average or other statistical measure from respective SCL 414 of the samples 410, the page type sampling component 220 can search the BFEA bin table 420 for a BFEA bin that corresponds to the mean, average or other statistical measure of the respective SCLs 414 of the samples 410. For example, the page type sampling component 220 can determine that the average of the respective SCLs 414 corresponds to Bin-N 430. In some cases, rather than sampling multiple samples, the page type sampling component 220 can compute the SCL of a single reading from a random page of the group of memory blocks and uses the computed SCL to find the BFEA bin to associate with the group of memory blocks as the Bin-N 430.

Using the Bin-N 430, the page type sampling component 220 can then perform a fine bin selection process to associate different page types of the group of memory blocks with respective BFEA bins of the BFEA bin table 420 using respective pointers. For example, the page type sampling component 220 can communicate the Bin-N 430 to the BFEA bin selection component 230 of FIG. 2. The BFEA bin selection component 230 can then generate a first collection of samples representing RBER of different BFEA bins that are adjacent to the Bin-N 430 and can store the first collection of samples in a table.

For example, the BFEA bin selection component 230 can select a first page type (e.g., an LP page) from the group of memory blocks and/or random pages of the memory blocks. The BFEA bin selection component 230 can retrieve the read threshold voltage offsets associated with the Bin-N 430 and can read the data from the first page type of the pages of the memory blocks as individual samples 442. The BFEA bin selection component 230 can compute the RBER resulting from reading the data using the read threshold voltage offsets associated with the Bin-N 430. This set of RBER values 452 can be stored in a corresponding column or portion 450 of the table. The BFEA bin selection component 230 can retrieve the read threshold voltage offsets associated with a previous BFEA bin that is adjacent to the Bin-N 430 and can read the data from the first page type of the pages of the memory blocks. The BFEA bin selection component 230 can compute the RBER resulting from reading the data using the read threshold voltage offsets associated with the previous BFEA bin. This set of RBER values 462 can be stored in a corresponding column or portion 460 of the table. The BFEA bin selection component 230 can retrieve the read threshold voltage offsets associated with a next BFEA bin that is adjacent to the Bin-N 430 and can read the data from the first page type of the pages of the memory blocks. The BFEA bin selection component 230 can compute the RBER resulting from reading the data using the read threshold voltage offsets associated with the next BFEA bin. This set of RBER values can be stored in a corresponding column or portion of the table.

For each sample 442, the BFEA bin selection component 230 can compare the RBER values that resulted from reading the data stored in the first page type. The BFEA bin selection component 230 can store an indication of the BFEA bin that corresponds to the lowest RBER values in the best bin column 470. For example, the BFEA bin selection component 230 can determine that, for a first sample, the best bin 472 corresponds to the previous bin because the RBER value 462 resulting from reading the data using the previous BFEA bin is lower than the RBER value 452 resulting from reading the data using the next BFEA bin. As another example, the BFEA bin selection component 230 can determine that, for a second sample, the best bin 472 corresponds to the previous bin because the RBER value 462 resulting from reading the data using the previous BFEA bin is lower than the RBER value 452 resulting from reading the data using the next BFEA bin. The BFEA bin selection component 230 can then determine which BFEA bin is stored in a majority of entries in the best bin column 470 across the samples 442. For example, the BFEA bin selection component 230 can determine that a majority of the samples 442 stored in the best bin column 470 the previous BFEA bin. This can be the case if reading data for samples 1-5 using the previous BFEA bin resulted in lower RBER values than reading data for samples 1-5 using the Bin-N 430 or the next BFEA bin and reading data for samples 6-8 using the next BFEA bin resulted in lower RBER values than reading data for samples 6-8 using the Bin-N 430 or the previous BFEA bin. Namely, the previous BFEA bin can be stored for each of the samples 1-5 and the next BFEA bin can be stored for each of the samples 6-8. Since the previous BFEA bin appeared a greater number of times across the samples 442 than the Bin-N 430 or the next BFEA bin, the previous BFEA bin is selected as the best BFEA bin 480 for the first page type. In such cases, the BFEA bin selection component 230 can store the previous BFEA bin in first page type pointer among the list of pointers 490 that are used to retrieve read threshold offset values from the BFEA bin table 420 when reading data of the first page type.

Similarly, the BFEA bin selection component 230 can select a second page type (e.g., an UP page) from the group of memory blocks and/or random pages of the memory blocks. The BFEA bin selection component 230 can retrieve the read threshold voltage offsets associated with the Bin-N 430 and can read the data from the second page type of the pages of the memory blocks as individual samples 442. The BFEA bin selection component 230 can compute the RBER resulting from reading the data using the read threshold voltage offsets associated with the Bin-N 430. This set of RBER values 452 can be stored in a corresponding column or portion 450 of the table. The BFEA bin selection component 230 can retrieve the read threshold voltage offsets associated with a previous BFEA bin that is adjacent to the Bin-N 430 and can read the data from the second page type of the pages of the memory blocks. The BFEA bin selection component 230 can compute the RBER resulting from reading the data using the read threshold voltage offsets associated with the previous BFEA bin. This set of RBER values 462 can be stored in a corresponding column or portion 460 of the table. The BFEA bin selection component 230 can retrieve the read threshold voltage offsets associated with a next BFEA bin that is adjacent to the Bin-N 430 and can read the data from the second page type of the pages of the memory blocks. The BFEA bin selection component 230 can compute the RBER resulting from reading the data using the read threshold voltage offsets associated with the next BFEA bin. This set of RBER values can be stored in a corresponding column or portion of the table.

For each sample 442, the BFEA bin selection component 230 can compare the RBER values that resulted from reading the data stored in the second page type. The BFEA bin selection component 230 can store an indication of the BFEA bin that corresponds to the lowest RBER values in the best bin column 470. As previously discussed, the BFEA bin selection component 230 can determine that a majority of the samples 442 stored in the best bin column 470 the previous BFEA bin. In such cases, the BFEA bin selection component 230 can store the previous BFEA bin in second page type pointer among the list of pointers 490 that are used to retrieve read threshold offset values from the BFEA bin table 420 when reading data of the second page type.

Similarly, the BFEA bin selection component 230 can select a third page type (e.g., an XP page) from the group of memory blocks and/or random pages of the memory blocks. The BFEA bin selection component 230 can retrieve the read threshold voltage offsets associated with the Bin-N 430 and can read the data from the third page type of the pages of the memory blocks as individual samples 442. The BFEA bin selection component 230 can compute the RBER resulting from reading the data using the read threshold voltage offsets associated with the Bin-N 430. This set of RBER values 452 can be stored in a corresponding column or portion 450 of the table. The BFEA bin selection component 230 can retrieve the read threshold voltage offsets associated with a previous BFEA bin that is adjacent to the Bin-N 430 and can read the data from the third page type of the pages of the memory blocks. The BFEA bin selection component 230 can compute the RBER resulting from reading the data using the read threshold voltage offsets associated with the previous BFEA bin. This set of RBER values 462 can be stored in a corresponding column or portion 460 of the table.

The BFEA bin selection component 230 can retrieve the read threshold voltage offsets associated with a next BFEA bin that is adjacent to the Bin-N 430 and can read the data from the third page type of the pages of the memory blocks. The BFEA bin selection component 230 can compute the RBER resulting from reading the data using the read threshold voltage offsets associated with the next BFEA bin. This set of RBER values can be stored in a corresponding column or portion of the table.

For each sample 442, the BFEA bin selection component 230 can compare the RBER values that resulted from reading the data stored in the third page type. The BFEA bin selection component 230 can store an indication of the BFEA bin that corresponds to the lowest RBER values in the best bin column 470. As previously discussed, the BFEA bin selection component 230 can determine that a majority of the samples 442 stored in the best bin column 470 the Bin-N 430. In such cases, the BFEA bin selection component 230 can store the Bin-N 430 in third page type pointer among the list of pointers 490 that are used to retrieve read threshold offset values from the BFEA bin table 420 when reading data of the third page type.

In some examples, the BFEA bin selection component 230 can only measure the RBER for a single sample or page using multiple BFEA bins. In such cases, rather than finding a majority in the best bin column 470, the BFEA bin selection component 230 selects the BFEA bin that resulted in the lowest RBER for that single sample. For example, the BFEA bin selection component 230 can select a particular page type (e.g., an LP page) from the group of memory blocks and/or random pages of the memory blocks. The BFEA bin selection component 230 can retrieve the read threshold voltage offsets associated with the Bin-N 430 and can read the data from the particular page type of the pages of the memory blocks as individual samples 442. The BFEA bin selection component 230 can compute the RBER resulting from reading the data using the read threshold voltage offsets associated with the Bin-N 430. This set of RBER values 452 can be stored in a corresponding column or portion 450 of the table. The BFEA bin selection component 230 can retrieve the read threshold voltage offsets associated with a previous BFEA bin that is adjacent to the Bin-N 430 and can read the data from the particular page type of the pages of the memory blocks. The BFEA bin selection component 230 can compute the RBER resulting from reading the data using the read threshold voltage offsets associated with the previous BFEA bin. This set of RBER values 462 can be stored in a corresponding column or portion 460 of the table. The BFEA bin selection component 230 can retrieve the read threshold voltage offsets associated with a next BFEA bin that is adjacent to the Bin-N 430 and can read the data from the particular page type of the pages of the memory blocks. The BFEA bin selection component 230 can compute the RBER resulting from reading the data using the read threshold voltage offsets associated with the next BFEA bin. This set of RBER values can be stored in a corresponding column or portion of the table and provided as the best BFEA bin 480 for the particular page type. This process can be repeated across each of the page types.

In some examples, the read error correction module 200 can perform the above processes on a per memory block basis rather than on a block family basis. In such cases, the read error correction module 200 can select a memory block from the set of memory components 112A to 112N (e.g., randomly or according to a suitable selection process). The read error correction module 200 can read data from the selected memory block and compute the SCL associated with reading the data. The read error correction module 200 can identify a threshold read voltage from a BFEA bin table based on the computed SCL. Then, the read error correction module 200 can then read different page types from the selected memory block using the identified threshold read voltage, such as using adjacent threshold voltages in the BFEA bin table, and compute the RBER associated with reading the data. Based on the computed RBER, the read error correction module 200 can refine the selection of the threshold read voltage for each page type to reduce the RBER per page type.

While the disclosed examples are described in the context of a TLC memory where level 7 of the TLC memory is used as a basis for performing the course selection, similar techniques can be applied to any other type of storage, such as QLC, MLC, and/or any other suitable type of storage process.

FIG. 5 is a flow diagram of an example method 500 to perform read error correction, in accordance with some examples. Method 500 can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some examples, the method 500 is performed by the memory sub-system controller 115 of FIG. 1. In these examples, the method 500 can be performed, at least in part, by the read error correction module 122. Although the processes are shown in a particular sequence or order, unless otherwise specified, the order of the processes can be modified. Thus, the illustrated examples should be understood only as examples; the illustrated processes can be performed in a different order, and some processes can be performed in parallel. Additionally, one or more processes can be omitted in various examples. Thus, not all processes are required in every example. Other process flows are possible.

Referring now to FIG. 5, the method 500 or process begins at operation 505, with a processing device of a memory sub-system (e.g., of processor of the memory sub-system controller 115) selecting a group of memory blocks stored in a set of memory components. At operation 510, the processing device of the memory sub-system determines that the group of memory blocks is associated with a current bin of a plurality of bins, each bin of the plurality of bins comprising a respective plurality of read threshold offsets and, at operation 515, samples data stored in the group of memory blocks across different page types using the current bin. The processing device of the memory sub-system, at operation 520, in response to sampling the data, associates the different page types of the group of memory blocks with respective pointers to different bins of the plurality of bins for subsequently reading data from the group of memory blocks.

In view of the disclosure above, various examples are set forth below. It should be noted that one or more features of an example, taken in isolation or combination, should be considered within the disclosure of this application.

Example 1. A system comprising: a set of memory components; and at least one processing device, operatively coupled to the set of memory components, configured to perform operations comprising: selecting a group of memory blocks stored in the set of memory components; determining that the group of memory blocks is associated with a current bin of a plurality of bins, each bin of the plurality of bins comprising a respective plurality of read threshold offsets; sampling data stored in the group of memory blocks across different page types using the current bin; and in response to sampling the data, associating the different page types of the group of memory blocks with respective pointers to different bins of the plurality of bins for subsequently reading data from the group of memory blocks.

Example 2. The system of Example 1, the operations comprising: associating a first page type of the group of memory blocks with a first pointer corresponding to a first bin of the plurality of bins; and associating a second page type for the group of memory blocks with a second pointer corresponding to a second bin of the plurality of bins.

Example 3. The system of any one of Examples 1-2, wherein the different page types comprise a lower page (LP), an upper page (UP), and extra page (XP), and wherein the plurality of bins comprises block family error avoidance (BFEA) bins.

Example 4. The system of any one of Examples 1-3, the operations comprising: storing a block family error avoidance (BFEA) bin table comprising the plurality of bins, the BFEA bin table comprising a plurality of levels of a tri-level cell (TLC) page, a first set of bins comprising a first set of read threshold offsets for each of the plurality of levels, and a second set of bins comprising a second set of read threshold offsets for each of the plurality of levels.

Example 5. The system of Example 4, the operations comprising: reading a plurality of pages across a plurality of blocks in the group of memory blocks using the current bin to generate a plurality of samples; measuring slow charge loss (SCL) movement for each of the plurality of samples on a first page type to generate a first set of samples; and measuring SCL movement for each of the plurality of samples on a second page type to generate a second set of samples.

Example 6. The system of Example 5, the operations comprising: computing a first average of the first set of samples; selecting a first BFEA bin from the BFEA table based on the first average; and associating the first page type of the group of memory blocks with the first BFEA bin using a first pointer.

Example 7. The system of Example 6, the operations comprising: computing a second average of the second set of samples; selecting a second BFEA bin from the BFEA table based on the second average; and associating the second page type of the group of memory blocks with the second BFEA bin using a second pointer.

Example 8. The system of Example 7, wherein the first page type corresponds to level 5 of the plurality of levels, and wherein the second page type corresponds to levels greater than level 5 of the plurality of levels.

Example 9. The system of any one of Examples 5-8, wherein the plurality of samples is generated from reading three pages across three memory blocks on an individual word line group (WLG).

Example 10. The system of any one of Examples 4-9, the operations comprising: reading one or more of pages of a first page type across one or more blocks in the group of memory blocks using the current bin to generate one or more samples; measuring slow charge loss (SCL) movement for each of the one or more samples on the first page type to generate a first set of samples; selecting a first BFEA bin from the BFEA table based on the first set of samples; computing read bit error rate (RBER) information based on the first BFEA bin; and associating the different page types of the group of memory blocks with the respective pointers based on the RBER information.

Example 11. The system of Example 10, wherein the first page type comprises an extra page (XP) page type corresponding to level seven of the plurality of levels.

Example 12. The system of any one of Examples 10-11, the operations comprising: reading a first set of data stored in a second page type across different pages and different memory blocks in the group of memory blocks using the first BFEA bin to compute a first set of the RBER samples; and reading a second set of data stored in the second page type across the different pages and the different memory blocks in the group of memory blocks using a second BFEA bin that is adjacent to the first BFEA bin to compute a second set of the RBER samples.

Example 13. The system of Example 12, the operations comprising: for a first read portion of the different pages and the different memory blocks, selecting a first best BFEA bin by comparing an individual sample of the first set of RBER samples with an individual sample of the second set of RBER samples to identify which is associated with a lower RBER; and for a second read portion of the different pages and the different memory blocks, selecting a second best BFEA bin by comparing another individual sample of the first set of RBER samples with another individual sample of the second set of RBER samples to identify which is associated with the lower RBER.

Example 14. The system of any one of Examples 12-13, the operations comprising: for each read portion of the different pages and the different memory blocks, selecting a best BFEA bin by comparing an individual sample of the first set of RBER samples with an individual sample of the second set of RBER samples to identify which is associated with a lower RBER.

Example 15. The system of Example 14, the operations comprising: determining that the best BFEA bin of a majority of the read portions of the different pages and the different memory blocks comprises the second BFEA bin; and in response to determining that the best BFEA bin of the majority of the read portions of the different pages and the different memory blocks comprises the second BFEA bin, associating the second page type for the group of memory blocks with the second BFEA bin using a first pointer.

Example 16. The system of any one of Examples 12-15, the operations comprising: reading a third set of data stored in a third page type across different pages and different memory blocks in the group of memory blocks using the first BFEA bin to compute a third set of the RBER samples; reading a fourth set of data stored in the third page type across the different pages and the different memory blocks in the group of memory blocks using the second BFEA bin that is adjacent to the first BFEA bin to compute a fourth set of the RBER samples; for each read portion of the different pages and the different memory blocks of the third page type, selecting a best BFEA bin by comparing an individual sample of the third set of RBER samples with an individual sample of the fourth set of RBER samples to identify which is associated with a lower RBER; determining, for the third page type, that the best BFEA bin of a majority of the read portions of the different pages and the different memory blocks comprises the first BFEA bin; and in response to determining that the best BFEA bin of the majority of the read portions of the different pages and the different memory blocks comprises the first BFEA bin, associating the second page type for the group of memory blocks with the first BFEA bin using a second pointer.

Example 17. The system of any one of Examples 12-16, the operations comprising: determining that the second set of RBER samples for the second page type corresponds to a lower RBER than the first set of RBER samples; and in response to determining that the second set of RBER samples for the second page type corresponds to the lower RBER than the first set of RBER samples, associating the second page type for the group of memory blocks with the second BFEA bin.

Example 18. The system of any one of Examples 10-17, wherein the first set of samples comprise one or more samples.

Example 19. A method comprising: selecting a group of memory blocks stored in a set of memory components; determining that the group of memory blocks is associated with a current bin of a plurality of bins, each bin of the plurality of bins comprising a respective plurality of read threshold offsets; sampling data stored in the group of memory blocks across different page types using the current bin; and in response to sampling the data, associating the different page types of the group of memory blocks with respective pointers to different bins of the plurality of bins for subsequently reading data from the group of memory blocks.

Example 20. A non-transitory computer-readable storage medium comprising instructions that, when executed by at least one processing device, cause the at least one processing device to perform operations comprising: selecting a group of memory blocks stored in a set of memory components; determining that the group of memory blocks is associated with a current bin of a plurality of bins, each bin of the plurality of bins comprising a respective plurality of read threshold offsets; sampling data stored in the group of memory blocks across different page types using the current bin; and in response to sampling the data, associating the different page types of the group of memory blocks with respective pointers to different bins of the plurality of bins for subsequently reading data from the group of memory blocks.

Methods and computer-readable storage medium with instructions for performing any one of the above Examples.

Figure 6:
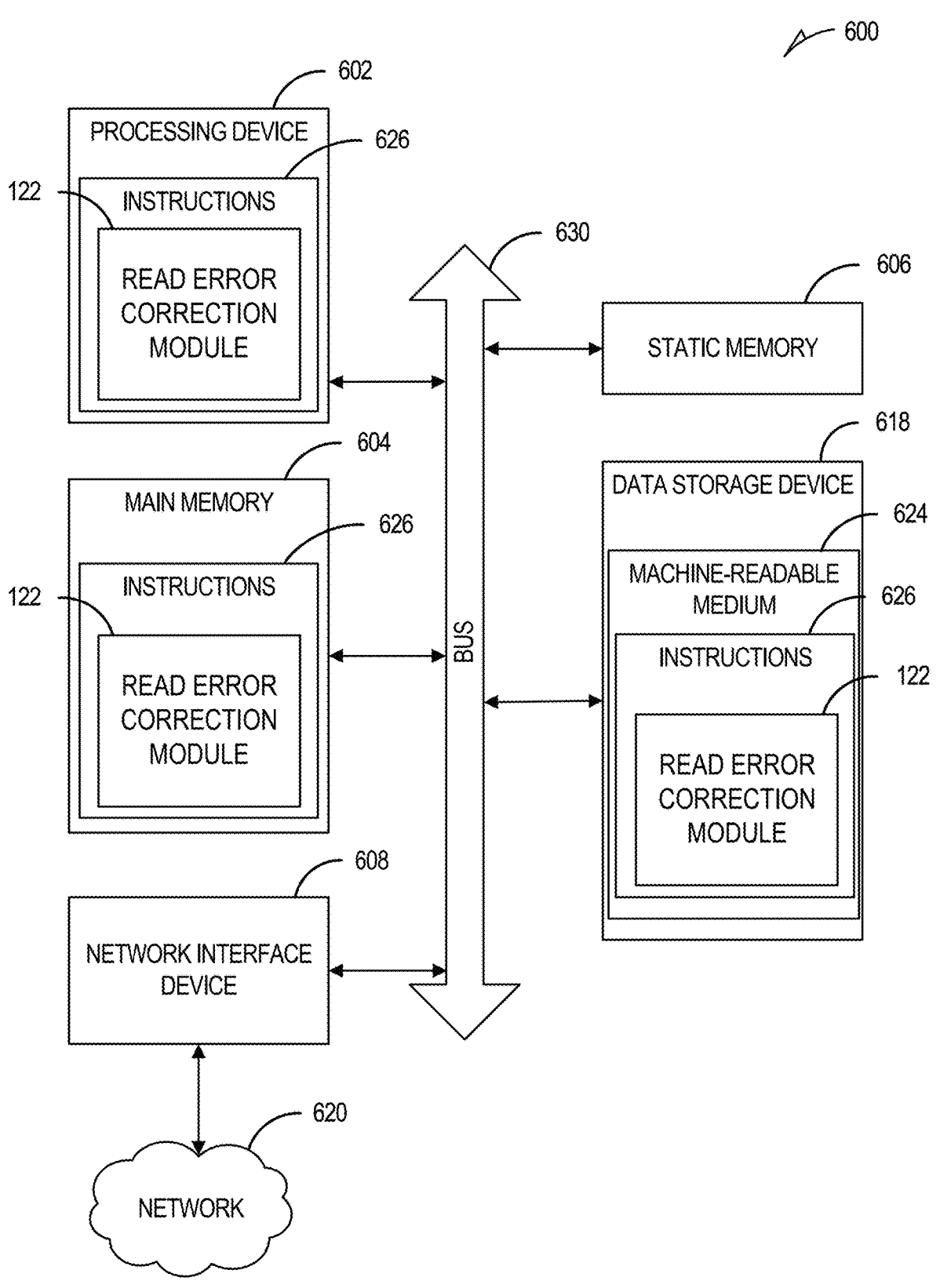
FIG. 6 is a block diagram illustrating a diagrammatic representation of a machine in the form of a computer system within which a set of instructions can be executed for causing the machine to perform any one or more of the methodologies discussed herein, in accordance with some embodiments of the present disclosure.

FIG. 6 illustrates an example machine in the form of a computer system 600 within which a set of instructions can be executed for causing the machine to perform any one or more of the methodologies discussed herein. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the read error correction module 122 of FIG. 1). In alternative embodiments, the machine can be connected (e.g., networked) to other machines in a local area network (LAN), an intranet, an extranet, and/or the Internet. The machine can operate in the capacity of a server or a client machine in a client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a network switch, a network bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random-access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

The processing device 602 represents one or more general-purpose processing devices such as a microprocessor, a central processing unit, or the like. More particularly, the processing device 602 can be a complex instruction set computing (CISC) microprocessor, a reduced instruction set computing (RISC) microprocessor, a very long instruction word (VLIW) microprocessor, a processor implementing other instruction sets, or processors implementing a combination of instruction sets. The processing device 602 can also be one or more special-purpose processing devices such as an application specific integrated circuit (ASIC), a field programmable gate array (FPGA), a digital signal processor (DSP), a network processor, or the like. The processing device 602 is configured to execute instructions 626 for performing the operations and steps discussed herein. The computer system 600 can further include a network interface device 608 to communicate over a network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to zone-based decoding (e.g., the read error correction module 122 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system's memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. Such a computer program can be stored in a computer-readable storage medium, such as, but not limited to, any type of disk including floppy disks, optical disks, CD-ROMs, and magnetic-optical disks; read-only memories (ROMs); random access memories (RAMs); erasable programmable read-only memories (EPROMs); EEPROMs; magnetic or optical cards; or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description above. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine-readable (e.g., computer-readable) storage medium such as a read-only memory (ROM), random access memory (RAM), magnetic disk storage media, optical storage media, flash memory components, and so forth.

In the foregoing specification, embodiments of the disclosure have been described with reference to specific example embodiments thereof. It will be evident that various modifications can be made thereto without departing from the embodiments of the disclosure as set forth in the following claims. The specification and drawings are, accordingly, to be regarded in an illustrative sense rather than a restrictive sense.

What is claimed is:

1. A system comprising:
a set of memory components; and
at least one processing device, operatively coupled to the set of memory components, programmed to perform operations comprising:
selecting a group of memory blocks stored in the set of memory components;
determining that the group of memory blocks is associated with a current bin of a plurality of bins, each bin of the plurality of bins comprising a respective plurality of read threshold offsets;
sampling data stored in the group of memory blocks across different page types using the current bin; and
based on sampling the data, associating the different page types of the group of memory blocks with respective pointers to different bins of the plurality of bins for subsequently reading data from the group of memory blocks, the associating of the different page types with the respective pointers being performed at least in part by:
selecting a first bin based on a first set of samples generated based on data read from one or more pages of a first page type across one or more blocks; and
reading a first set of data stored in a second page type across different pages and different memory blocks using the first bin to compute a first set of bit error rate (BER) samples and reading a second set of data stored in the second page type across the different pages and the different memory blocks using a second bin that is adjacent to the first bin to compute a second set of (BER) samples.

2. The system of claim 1, the operations comprising:
associating a first page type of the group of memory blocks with a first pointer corresponding to the first bin of the plurality of bins; and
associating a second page type for the group of memory blocks with a second pointer corresponding to the second bin of the plurality of bins.

3. The system of claim 1, wherein the different page types comprise a lower page (LP), an upper page (UP), and extra page (XP), and wherein the plurality of bins comprises block family error avoidance (BFEA) bins.

4. The system of claim 1, the operations comprising:
storing a block family error avoidance (BFEA) bin table comprising the plurality of bins, the BFEA bin table comprising a plurality of levels of a tri-level cell (TLC) page, a first set of bins comprising a first set of read threshold offsets for each of the plurality of levels, and a second of bins comprising a second set of read threshold offsets for each of the plurality of levels.

5. The system of claim 4, the operations comprising:
reading a plurality of pages across a plurality of blocks in the group of memory blocks using the current bin to generate a plurality of samples;
measuring slow charge loss (SCL) movement for each of the plurality of samples on a first page type to generate a first set of samples; and
measuring SCL movement for each of the plurality of samples on a second page type to generate a second set of samples.

6. The system of claim 5, the operations comprising:
computing a first average of the first set of samples;
selecting, as the first bin, a first BFEA bin from the BFEA bin table based on the first average; and
associating the first page type of the group of memory blocks with the first BFEA bin using a first pointer.

7. The system of claim 6, the operations comprising:
computing a second average of the second set of samples;
selecting, as the second bin, a second BFEA bin from the BFEA bin table based on the second average; and
associating the second page type of the group of memory blocks with the second BFEA bin using a second pointer.

8. The system of claim 7, wherein the first page type corresponds to level 5 of the plurality of levels, and wherein the second page type corresponds to levels greater than level 5 of the plurality of levels.

9. The system of claim 5, wherein the plurality of samples is generated from reading three pages across three memory blocks on an individual word line group (WLG).

10. The system of claim 4, the operations comprising:
reading one or more of pages of the first page type across the one or more blocks in the group of memory blocks using the current bin to generate one or more samples;
measuring slow charge loss (SCL) movement for each of the one or more samples on the first page type to generate a first set of samples;
selecting, as the first bin, a first BFEA bin from the BFEA bin table based on the first set of samples;
computing BER information based on the first BFEA bin; and
associating the different page types of the group of memory blocks with the respective pointers based on the BER information.

11. The system of claim 1, the operations comprising:
reading multiple samples from the first page type using the first bin and the second bin, adjacent to the first bin, from the plurality of bins, wherein for each sample an BER is computed for each of the first bin and the second bin;
identifying, for each individual sample, which bin between the first bin and the second bin resulted in a lowest BER; and
selecting a bin for the first page type based on which bin was identified as having the lowest BER across a majority of the samples.

12. The system of claim 1, the operations comprising:
selecting a best bin for the second page type using the first set of BER samples and the second set of BER samples.

13. The system of claim 12, wherein the first bin is a first block family error avoidance (BFEA) bin, and the second bin is a second BFEA bin, the operations comprising:
for a first read portion of the different pages and the different memory blocks, selecting a first best BFEA bin by comparing an individual sample of the first set of BER samples with an individual sample of the second set of BER samples to identify which is associated with a lower BER; and
for a second read portion of the different pages and the different memory blocks, selecting a second best BFEA bin by comparing another individual sample of the first set of BER samples with another individual sample of the second set of BER samples to identify which is associated with the lower BER.

14. The system of claim 12, wherein the first bin is a first block family error avoidance (BFEA) bin, and the second bin is a second BFEA bin, the operations comprising:

for each read portion of the different pages and the different memory blocks, selecting a best BFEA bin by comparing an individual sample of the first set of BER samples with an individual sample of the second set of BER samples to identify which is associated with a lower BER.

15. The system of claim 14, the operations comprising:
determining that the best BFEA bin of a majority of the read portions of the different pages and the different memory blocks comprises the second BFEA bin; and
in response to determining that the best BFEA bin of the majority of the read portions of the different pages and the different memory blocks comprises the second BFEA bin, associating the second page type for the group of memory blocks with the second BFEA bin using a first pointer.

16. The system of claim 12, wherein the first bin is a first block family error avoidance (BFEA) bin, and the second bin is a second BFEA bin, the operations comprising:
reading a third set of data stored in a third page type across different pages and different memory blocks in the group of memory blocks using the first BFEA bin to compute a third set of the BER samples;
reading a fourth set of data stored in the third page type across the different pages and the different memory blocks in the group of memory blocks using the second BFEA bin that is adjacent to the first BFEA bin to compute a fourth set of the BER samples;
for each read portion of the different pages and the different memory blocks of the third page type, selecting a best BFEA bin by comparing an individual sample of the third set of BER samples with an individual sample of the fourth set of BER samples to identify which is associated with a lower BER;
determining, for the third page type, that the best BFEA bin of a majority of the read portions of the different pages and the different memory blocks comprises the first BFEA bin; and
in response to determining that the best BFEA bin of the majority of the read portions of the different pages and the different memory blocks comprises the first BFEA bin, associating the second page type for the group of memory blocks with the first BFEA bin using a second pointer.

17. The system of claim 12, wherein the first bin is a first block family error avoidance (BFEA) bin, and the second bin is a second BFEA bin, the operations comprising:
determining that the second set of BER samples for the second page type corresponds to a lower BER than the first set of BER samples; and
in response to determining that the second set of BER samples for the second page type corresponds to the lower BER than the first set of BER samples, associating the second page type for the group of memory blocks with the second BFEA bin.

18. The system of claim 1, wherein a plurality of samples is generated from reading three pages across three memory blocks on an individual word line group (WLG), the first set of samples forming a portion of the plurality of samples.

24

19. A method comprising:
selecting a group of memory blocks stored in a set of memory components;
determining that the group of memory blocks is associated with a current bin of a plurality of bins, each bin of the plurality of bins comprising a respective plurality of read threshold offsets;
sampling data stored in the group of memory blocks across different page types using the current bin; and
based on sampling the data, associating the different page types of the group of memory blocks with respective pointers to different bins of the plurality of bins for subsequently reading data from the group of memory blocks, the associating of the different page types with the respective pointers being performed at least in part by:
selecting a first bin based on a first set of samples generated based on data read from one or more pages of a first page type across one or more blocks; and
reading a first set of data stored in a second page type across different pages and different memory blocks using the first bin to compute a first set of read bit error rate (RBER) samples and reading a second set of data stored in the second page type across the different pages and the different memory blocks using a second bin that is adjacent to the first bin to compute a second set of RBER samples.

20. A non-transitory computer-readable storage medium comprising instructions that, when executed by at least one processing device, cause the at least one processing device to perform operations comprising:
selecting a group of memory blocks stored in a set of memory components;
determining that the group of memory blocks is associated with a current bin of a plurality of bins, each bin of the plurality of bins comprising a respective plurality of read threshold offsets;
sampling data stored in the group of memory blocks across different page types using the current bin; and
based on sampling the data, associating the different page types of the group of memory blocks with respective pointers to different bins of the plurality of bins for subsequently reading data from the group of memory blocks, the associating of the different page types with the respective pointers being performed at least in part by:
selecting a first bin based on a first set of samples generated based on data read from one or more pages of a first page type across one or more blocks; and
reading a first set of data stored in a second page type across different pages and different memory blocks using the first bin to compute a first set of read bit error rate (RBER) samples and reading a second set of data stored in the second page type across the different pages and the different memory blocks using a second bin that is adjacent to the first bin to compute a second set of RBER samples.

* * * * *